(12) United States Patent
Vitale et al.

(10) Patent No.: US 7,687,396 B2
(45) Date of Patent: Mar. 30, 2010

(54) METHOD OF FORMING SILICIDED GATES USING BURIED METAL LAYERS

(75) Inventors: Steven Arthur Vitale, Murphy, TX (US); Shaofeng Yu, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 107 days.

(21) Appl. No.: 11/617,897

(22) Filed: Dec. 29, 2006

(65) Prior Publication Data

US 2008/0157258 A1   Jul. 3, 2008

(51) Int. Cl.
  *H01L 21/44* (2006.01)
(52) U.S. Cl. .................. 438/664; 438/660; 438/197
(58) Field of Classification Search ............ 438/664, 438/660, 197
See application file for complete search history.

(56) References Cited

U.S. PATENT DOCUMENTS 7,105,440 B2 * 9/2006 Luo et al. .................. 438/664

OTHER PUBLICATIONS

Derwent 2007-278325, Oct. 2006, Derwent.*

* cited by examiner

*Primary Examiner*—Long Pham
(74) *Attorney, Agent, or Firm*—John J. Patti; Wade J. Brady, III; Frederick J. Telecky, Jr.

(57) ABSTRACT

A method comprises forming a gate stack comprising a polysilicon layer, a metal layer and a polysilicon layer over a gate dielectric and substrate. The metal layer is buried inside the gate stack to alloy the silicon and metal at the bottom of the gate. The gate stack is then etched to form a gate. A silicidation is then performed to form a silicide at the bottom of the gate. Optionally, a second metal layer may be formed on top of the gate stack. As such, during silicidation, a silicide may be formed at the top of the gate.

19 Claims, 3 Drawing Sheets

METHOD OF FORMING SILICIDED GATES USING BURIED METAL LAYERS

FIELD

This invention relates generally to semiconductor fabrication.

BACKGROUND

Currently, metal gate electrodes are being investigated to replace polysilicon gate electrodes in today's ever shrinking and changing semiconductor devices. Traditionally, a polysilicon gate electrode with an overlying silicide was used for the gate electrodes in CMOS devices. However, as device feature size continues to shrink, poly depletion becomes a serious issue when using polysilicon gate electrodes. The polysilicon gate electrodes may be replaced with metal gate electrodes in order to solve problems of polysilicon-depletion effects and boron penetration when forming semiconductor device features.

Recently, silicided metal gates have been utilized in semiconductor device components, such as gates. Typically, in forming silicided gates, polysilicon is deposited over a gate dielectric. Then, a metal is deposited over the polysilicon and reacted to completely consume the polysilicon resulting in a fully silicided metal gate, in lieu of a deposited metal gate. The silicided metal gate provides a metal gate with the least perturbation to the conventional process and avoids contamination issues. Furthermore, polysilicon doping has been shown to affect the work function of the silicided metal gates.

According to the conventional process, the gates and other semiconductor components such as moats must be silicided at the same time. However, for fully silicided gates, the gates and other components cannot be silicided simultaneously because the fully silicided gate will require a different metal or different deposition thickness than other components.

SUMMARY

An embodiment of the present disclosure is directed to a method of fabricating a semiconductor device. The method comprises forming a gate stack. The gate stack comprises a gate dielectric layer, a first silicon layer adjacent to a substrate; a first metal layer over the first silicon layer; and a second silicon layer over the first metal layer. The method further comprises patterning the gate stack; and performing a silicidation process to form metal and silicon alloy regions in the patterned gate stack. At least one alloy region is formed adjacent to the substrate.

Another embodiment of the present disclosure is directed to a method of forming a silicided gate. The method comprises forming a first silicon layer adjacent to a gate dielectric layer; forming a first metal layer over the first silicon layer; forming a second silicon layer over the first metal layer; and performing a silicidation process to form metal and silicon alloy regions in the gate. At least one alloy region is formed adjacent to the gate dielectric layer.

Another embodiment of the present disclosure is directed to a semiconductor device. The device comprises a substrate; a gate dielectric layer positioned adjacent to the substrate; and a gate stack positioned over the gate dielectric. The gate stack comprises a first metal and silicon alloy layer positioned adjacent to the gate dielectric layer, a silicon layer position over the first alloy layer, and a second metal and silicon alloy layer positioned adjacent to the silicon layer.

Additional embodiments will be set forth in part in the description which follows, and in part will be obvious from the description, or may be learned by practice of the embodiments of the present disclosure. The embodiments will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments and together with the description, serve to explain the principles of the invention.

DESCRIPTION OF THE EMBODIMENTS

Figure 1:
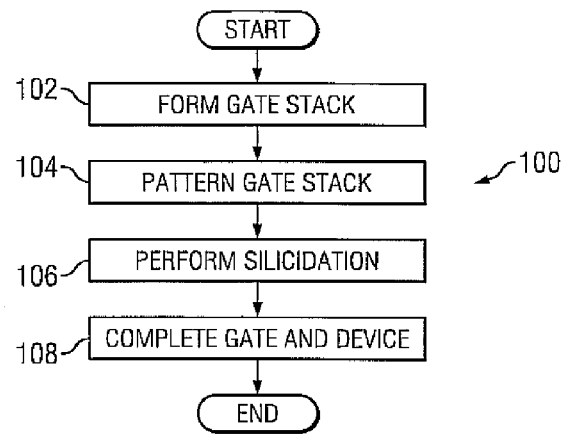
FIG. 1 is a flow diagram illustrating a method for forming a silicided gate.

According to embodiments of the present disclosure, a gate may be formed with metal and silicon alloys (silicides) at the bottom and top of the gate. Methods of the present disclosure comprise forming a gate stack comprising a polysilicon layer, a metal layer and a polysilicon layer over a gate dielectric and substrate. The metal layer is buried inside the gate stack to alloy the silicon and metal at the bottom of the gate. The gate stack is then etched to form a gate. A silicidation is then performed to form a silicide at the bottom of the gate. Optionally, a second metal layer may be formed on top of the gate stack. As such, during silicidation, a silicide may be formed at the top of the gate.

By forming a metal layer near the bottom of the gate, a likelihood of forming a silicide down to the gate dielectric is increased. Further, since the metal layer is separated from the gate dielectric by a polysilicon layer, the metal may be etched without punching through the gate dielectric. Additionally, silicidation of the gate and other features may be performed in separate processes to allow the use of different metals.

Additionally, by allowing separate metal layers to be formed at the top and bottom of the gate, different metals may be utilized for the top and bottom of the gate. Further, the top metal layer may be utilized as a mask during formation of the gate.

Reference will now be made in detail to the exemplary embodiments of the present disclosure, an example of which is illustrated in the accompanying drawings. Wherever possible, the same reference numbers will be used throughout the drawings to refer to the same or like parts.

In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

Notwithstanding that the numerical ranges and parameters setting forth the broad scope of the present disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

FIG. 1 is flow diagram illustrating a method 100 of forming silicided gates consistent with embodiments of the present disclosure. According to embodiments of the present disclosure, metal and silicon alloys (silicides) may be formed at the bottom and the top of the gate by employing separate metal layers formed at the bottom and top of the gate stack.

Method 100 begins with forming a gate stack (stage 102). The gate stack may be formed on any underlying semiconductor structure. For example, the gate stack may be formed on an active region of a semiconductor substrate that has undergone shallow trench isolation (STI) and ion implantation. As such, the gate stack may be the precursor of a gate for a semiconductor device such as a transistor. Additionally, the underlying semiconductor structure may include a gate dielectric.

According to embodiments of the present disclosure, the gate stack comprises a thin polysilicon layer, a thin metal layer, and a thick polysilicon layer, stacked respectively. The gate stack may be formed on the gate dielectric. During silicidation, the thin metal layer and the thin and thick polysilicon layers may be combined to form a silicide layer at the bottom of the gate. The layers may be formed utilizing any conventional method for forming gate metal and polysilicon layers.

According to other embodiments of the present disclosure, the gate stack may also include a second thin metal layer over the thick polysilicon layer. During silicidation, the thin metal layer and the thick polysilicon layer may be combined to form a silicide layer at the top of the gate. By utilizing two separate metal layers, different composition silicides may be formed at the bottom of the gate and the top of the gate. Further, the second metal layer may be utilized as a mask during subsequent etches.

Metal layers in the gate stack may be formed of any type of metal capable of combining with silicon during silicidation. For example, the metal layers can be, but are not limited to, Ni, Pt, Co, W, Hf, Ta, Tl, or combinations thereof.

After forming the gate stack, the gate stack is patterned and etched to form a gate structure (stage 104). The gate stack may be patterned and etched utilizing any well-known process to form a gate structure. For example, the gate stack may be etched utilizing a high temperature cathode gate etcher.

Once the gate structure is formed, a silicidation is performed on the gate structure to form a silicide in the gate structure (stage 106). The silicidation may be any type of well-known process to cause the metal and polysilicon of the gate to combine to form a silicide. For example, the gate structure may be subjected to an anneal at a temperature to cause the combination of the metal and silicon of the gate structure.

Next, the gate structure and semiconductor device may be completed (stage 108). The gate structure and semiconductor device may undergo any well-known processes to allow the semiconductor device to become operational. For example, additional structures may be added to the gate, such as sidewall. Further, additional layers, such as contact holes and lines, may be formed over the substrate and gate.

As mentioned above, the silicidation may be performed after the gate etch and prior to forming other features of the gate structure and semiconductor device. Nonetheless, silicidation may be performed subsequent to performing post gate etch processing, such as sidewall deposition, etch, implant, or the like. For example, the semiconductor device may undergo post gate etch processing (sidewall deposition, etch, implant, etc.), and then the silicidation may be performed prior to contact liner deposition. Position of the silicidation in method 100 may depend on factors such as the anneal temperature of the particular metal used.

FIGS. 2A-K are schematic diagrams illustrating a method for forming an exemplary silicide gate consistent with embodiments of the present disclosure. According to embodiments, a polysilicon layer, a metal layer and a polysilicon layer are formed over a gate oxide and substrate. The layers are then etched to form a gate. A silicidation is then performed to form a silicide at the bottom of the gate. Optionally, a second metal layer may be formed on top of the gate stack. As such, during silicidation, a silicide may be formed at the top of the gate.

Figure 2A:
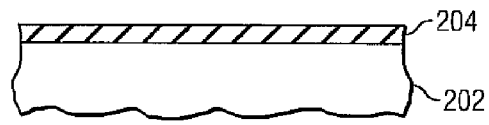
FIGS. 2A-2K are schematic diagrams illustrating an exemplary method for forming a silicided gate consistent with embodiments of the present disclosure.

As illustrated in FIG. 2A, the method begins with forming a dielectric layer 204 on a substrate 202. Dielectric layer 204 may function as a barrier between the gate contact and the substrate in the gate structure. Substrate 202 may be any combination of layers on which a silicided gate may be formed. For example, substrate 202 may include an active region of a semiconductor substrate that has undergone shallow trench isolation (STI) and ion implantation.

Dielectric layer 204 may be any type of dielectric to provide a barrier between the substrate and the gate. For example, dielectric layer 204 may be an oxide and high-k dielectric materials such as $SiO_2$ $HfO_2$, HfSiO, HfSiON, and the like, Dielectric layer 204 may be formed by any type of process for forming a dielectric layer on a semiconductor substrate. For example, dielectric layer 204 may be formed by thermally growing silicon dioxide ($SiO_2$). Dielectric layer 204 may be formed to a thickness ranging from approximately 1 nm to 70 nm.

Figure 2B:
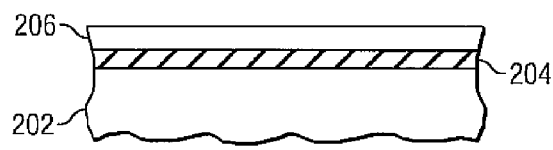

As illustrated in FIG. 2B, after formation of dielectric layer 204, a polysilicon layer 206 is formed on dielectric layer 204. Polysilicon layer 206 may be formed by any type of process for forming polycrystalline silicon. For example, polysilicon layer 206 may be formed by thermal chemical vapor deposition (CVD) of disilane at 725° C. in a single low pressure CVD (LPCVD) apparatus. Additionally, polysilicon layer 206 may be formed by a furnace deposition of silane at approximately 620° C. Polysilicon layer 206 may be formed to a thin thickness. For example, polysilicon layer 206 may be formed to a thickness of approximately 50 Å.

Figure 2C:
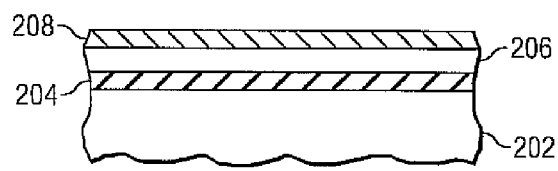

As illustrated in FIG. 2C, after formation of polysilicon layer 206, metal layer 208 is formed on polysilicon layer 206. Metal layer 208 is utilized in the formation of the silicon and metal alloy (silicide) at the bottom of the gate. Metal layer 208 is buried inside the gate stack to alloy the silicon and metal alloy to form at the bottom of the gate. Metal layer 208 may be formed by any type of deposition process for forming a metal. For example, metal layer 208 may be formed by CVD, physical vapor deposition (PVD), plasma-enhanced CVD, or the like.

Metal layer 208 may be formed of any type of metal capable of combining with silicon during silicidation. For example, metal layer 208 may be formed of Ni, Pt, Co, W, Hf, Ta, Ti, or combinations thereof Metal layer 208 may be formed to any thickness in order to properly form the silicide.

Metal layer 208 thickness may depend on the thickness of polysilicon layer 206. Metal layer 208 may be thick enough to fully consume polysilicon layer 206. For example, metal layer 208 may be formed to a thickness of approximately 50 Å.

Figure 2D:
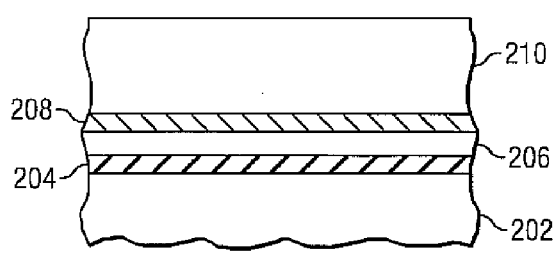
Figure 2E:
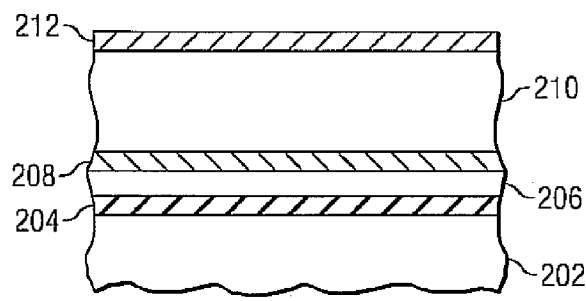

After formation of metal layer 208, a polysilicon layer 210 is formed on metal layer 208, as illustrated in FIG. 2D. Polysilicon layer 210 may be formed by any process for forming polycrystalline silicon. For example, polysilicon layer 206 may be formed by thermal CVD of disilane at 725° C. in a single LPCVD apparatus. Additionally, polysilicon layer 206 may be formed by a furnace deposition of silane at approximately 620° C. Polysilicon layer 206 may be formed to a thin thickness. Polysilicon layer 210 may be formed to a greater thickness than polysilicon layer 206. For example, polysilicon layer 210 may be formed to a thickness of approximately 600 Å.

After formation of polysilicon layer 210, an optional metal layer 212 may be formed on polysilicon layer 210. Metal layer 212 is utilized in the formation of the silicon and metal alloy (silicide) at the top of the gate. Metal layer 212 is formed over polysilicon layer 210 to alloy the silicon and metal alloy to form at the top of the gate. Metal layer 212 may be formed by any type of deposition process for forming a metal. For example, metal layer 212 may be formed by CVD, PVD, plasma-enhanced CVD, or the like.

Metal layer 212 may be formed of any type of metal capable of combining with silicon during silicidation. For example, metal layer 212 may be formed of Ni, Pt, Co, W, Hf, Ta, Ti, or combinations thereof. Metal layer 212 may be formed to a thin thickness. For example, metal layer 212 may be formed to a thickness of approximately 50 Å.

Figure 2F:
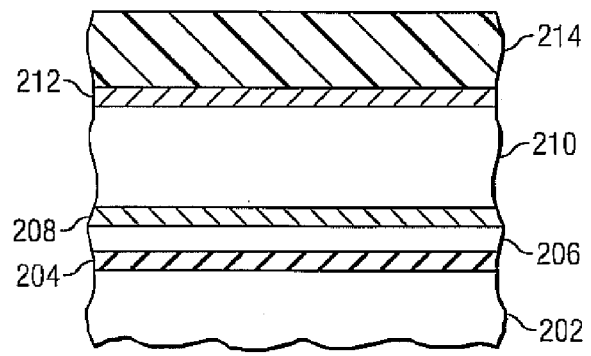
Figure 2G:
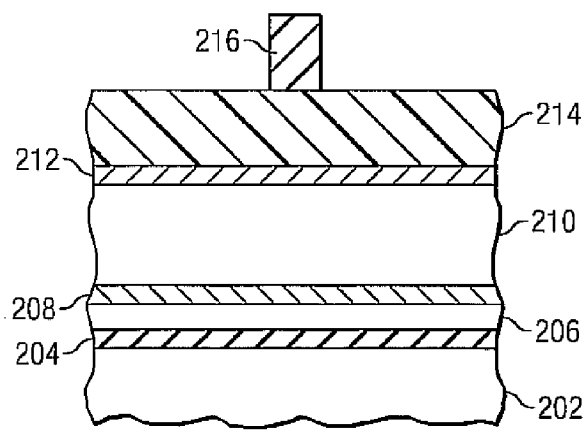
Figure 2H:
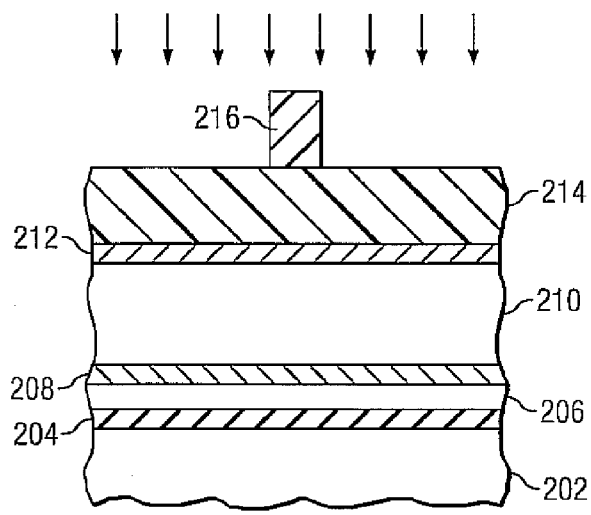

After formation of the gate stack, the gate stack may be patterned and portions of the stack may be removed to form the gate. FIG. 2F-H illustrate an exemplary method for forming the gate from the gate stack using a high temperature etch. As illustrated in FIG. 2F, a mask 214 may be formed on the top of the gate stack. Mask 214 may be formed of any material for protecting the gate structure during the etching process.

Then, a resist 216 may be formed on mask 214 in the shape of the gate as illustrated in FIG. 2G. Resist 216 may be formed of any type of material to allow a gate pattern to be transferred to mask 214. Then, resist 216 and mask 214 may be exposed and etched to from a gate structure as illustrated in FIG. 2H.

Figure 2I:
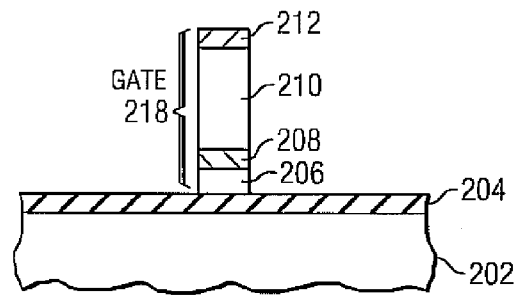

After the etching, mask 214 may be stripped leaving gate structure 218. As illustrated in FIG. 2I, the gate structure may be composed of patterned metal layer 212 (optional), polysilicon layer 210, metal layer 208, and polysilicon layer 206.

According to another embodiment of the present disclosure, metal layer 212 may be utilized as a mask during the etching process. In such a case, mask 214 may not be required during the etching process.

Figure 2J:
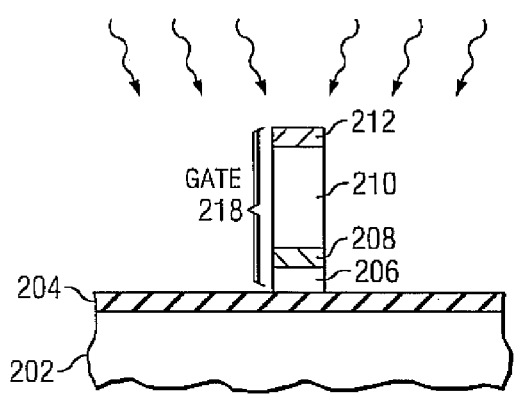

After gate structure 218 has been formed, as illustrated in FIG. 2J, a silicidation process may be performed on gate 218 to form a metal and silicon alloy (silicide) in gate 218. The silicidation process may comprise annealing gate 218 at a temperature sufficient to cause the polysilicon and metal to combine. For example, a rapid thermal anneal (RTA) at approximately 300 to 600° C. for approximately 30 seconds.

Figure 2K:
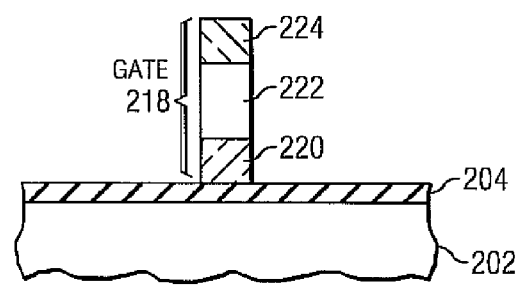

After silicidation, a silicide 220 is formed at the bottom of gate 218 adjacent to oxide 204 as illustrated in FIG. 2K. Silicide 220 may be formed to a thickness in a range of approximately 100-400 Å. Additionally, if metal layer 212 is included, a silicide 224 may be formed at the top of gate 218 during the silicidation. Silicide 224 may be formed to a thickness in a range of approximately 200-400 Å.

After formed the silicide gate 218, one skilled in the art will realize that additional processing may be performed to complete the semiconductor device. For example, oxide 204 may be removed to expose substrate 202. Additional structures may be added to gate 218 such as sidewall. Further, additional layers, such as contact holes and lines, may be formed over substrate 202 and gate 218.

Other embodiments of the present teaching will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a semiconductor device, the method comprising:
    forming a gate stack on a gate dielectric, wherein the gate stack includes a first silicon layer, a first metal layer over the first silicon layer, a second silicon layer over the first metal layer, and a second metal layer over the second silicon layer;
    patterning the gate stack; and
    performing a silicidation process to form metal and silicon alloy regions in the patterned gate stack, wherein at least one alloy region is formed adjacent to the gate dielectric layer, and wherein at least one alloy region is formed from the second silicon layer and the second metal layer.

2. The method of claim 1, wherein the method further comprises forming a semiconductor device including the gate stack.

3. The method of claim 1, wherein the first and second silicon layers are polysilicon layers.

4. The method of claim 3, wherein the step of forming the gate stack further comprises:
    depositing the first silicon layer adjacent to the dielectric layer;
    depositing the first metal layer over the first silicon layer;
    depositing the second silicon layer over the first metal layer; and
    depositing the second metal layer over the second silicon layer.

5. The method of claim 1, wherein the first and second metal layers further comprise metals selected from the group consisting of Ni, Pt, Co, W, Hf, Ti, and Ta.

6. The method of claim 1, wherein the first and second metal layers further comprise different metals.

7. The method of claim 1, wherein the step of patterning the gate stack further comprises:
    forming a mask over the gate stack;
    forming a photoresist over the mask;
    patterning the photoresist in a form of a gate; and
    performing an etch on the mask and gate stack to form a patterned gate stack.

8. The method of claim 1, wherein the step of performing the silicidation process further comprises annealing the gate stack.

9. The method of claim 1, wherein the second metal layer is utilized as a mask during patterning the gate stack.

10. A method comprising:
    forming a first silicon layer adjacent to a gate dielectric layer;
    forming a first metal layer over the first silicon layer;
    forming a second silicon layer over the first metal layer;
    forming a second metal layer over the second silicon layer; and patterning the first silicon layer, the first metal layer, the second silicon layer, and the second metal layer to form a patterned gate stack;

performing a silicidation process on the patterned gate stack to form metal and silicon alloy regions in the gate, wherein at least one alloy region is formed adjacent to the gate dielectric layer, and wherein at least one alloy region is formed from the second silicon layer and the second metal layer.

11. The method of claim 10, wherein the first and second silicon layers are polysilicon layers.

12. The method of claim 10, wherein the first and second metal layers further comprise metals selected from the group consisting of Ni, Pt, Co, W, Hf, Ti, and Ta.

13. The method of claim 10, wherein the first and second metal layers comprise different metals.

14. The method of claim 10, wherein the step of patterning further comprises:

forming a mask over the second metal layer;
forming a photoresist over the mask;
patterning the photoresist in a form of the gate; and
performing an etch to form the gate.

15. A method comprising:

forming a gate dielectric layer over at least a portion of a substrate;
forming a gate stack over the dielectric layer, wherein the step of forming the gate stack includes:
forming a first silicon layer over the gate dielectric layer;
forming a first metal layer over the first silicon layer;
forming a second silicon layer over the first metal layer;
forming a second metal layer over the second silicon layer;
forming a mask over the gate stack;
forming a photoresist layer over the mask;
patterning the photoresist in a form of a gate;
etching the mask and the gate stack to form a patterned gate stack that includes the first silicon layer, the first metal layer, the second silicon layer, and the second metal layer; and
annealing the patterned gate stack to form a first silicide layer over the gate dielectric layer, a portion of the second silicon layer over the first silicide layer, and a second silicide layer over the portion of the second silicon layer.

16. The method of claim 15, wherein the first and second silicon layers are polysilicon layers.

17. The method of claim 15, wherein the first and second metal layers further comprise metals selected from the group consisting of Ni, Pt, Co, W, Hf, Ti, and Ta.

18. The method of claim 15, wherein the first and second metal layers comprise different metals.

19. The method of claim 15, wherein the step of annealing is performed at about 300° C. to about 600° C. for about 30 seconds.

* * * * *